US007566876B2

(12) United States Patent
Moody et al.

(10) Patent No.: US 7,566,876 B2
(45) Date of Patent: Jul. 28, 2009

(54) IMAGE SENSOR

(75) Inventors: Ian Moody, Chelmsford (GB); Raymond Thomas Bell, Middlesex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 91 days.

(21) Appl. No.: 11/513,415

(22) Filed: Aug. 31, 2006

(65) Prior Publication Data

US 2007/0069142 A1 Mar. 29, 2007

(30) Foreign Application Priority Data

Aug. 31, 2005 (GB) ................. 0517741.5

(51) Int. Cl.
*G01T 1/24* (2006.01)
*H01L 31/062* (2006.01)
(52) U.S. Cl. .......................... 250/370.08; 250/370.01; 250/370.09; 250/370.11; 257/257; 257/258; 257/290; 257/291
(58) Field of Classification Search ............ 250/370.09, 250/370.11; 257/257, 258, 290–292
See application file for complete search history.

(56) References Cited

U.S. PATENT DOCUMENTS

| 6,097,021 | A | 8/2000 | Aswell et al. | |
| 6,323,490 | B1 * | 11/2001 | Ikeda et al. | 250/370.09 |
| 6,403,965 | B1 | 6/2002 | Ikeda et al. | |
| 6,453,008 | B1 * | 9/2002 | Sakaguchi et al. | 378/98.7 |
| 6,825,059 | B2 | 11/2004 | Fossum | |
| 6,870,209 | B2 * | 3/2005 | Dosluoglu et al. | 257/292 |
| 2001/0038075 | A1 * | 11/2001 | Morishita | 250/370.08 |
| 2003/0111674 | A1 | 6/2003 | Fossum | |
| 2004/0065840 | A1 * | 4/2004 | Morishita | 250/370.11 |

FOREIGN PATENT DOCUMENTS

| GB | 2083968 | 3/1982 |
| JP | 11352230 | 12/1999 |

OTHER PUBLICATIONS

British Search Report dated Oct. 27, 2005.

* cited by examiner

*Primary Examiner*—David P Porta
*Assistant Examiner*—Casey Bryant
(74) *Attorney, Agent, or Firm*—Venable LLP; Robert Kinberg; Robert S. Babayi

(57) ABSTRACT

Effective sensitivity of a photodetector of an image sensor is controlled by partitioning signal charge from incident photons, thus producing a manageable yield and a consequently higher, photon shot noise limited, signal to noise ratio than in the prior art, when imaging high flux rates of energetic photons or particles, such as produced by x-ray generators. The invention may be applied, for example, to an image sensor with a photosensitive layer coupled to a charge collection/readout structure, e.g. photoconductor or scintillator on CMOS array, or to an intrinsically sensitive charge collection/readout structure, e.g. deep active layer CMOS. A radiation sensor pixel structure 10 for use in the invention includes a photodetector 11, a transfer gate 131 for controlling charge collection from the photodetector and a dump drain 12 controlled by a dump gate 121, arranged for selectively dumping charge to the dump drain means and collecting charge from the photodetector means, in a duty cycle 31, for varying effective sensitivity of the pixel structure. An image sensor containing such pixel structures may selectively be operated in an integration mode or a photon counting mode. Preferably the image sensor has imaging pixels and control circuitry arranged on a same semiconductor die, such as a CMOS semiconductor die.

40 Claims, 3 Drawing Sheets

Pinned Photodiode with dump drain

IMAGE SENSOR

CROSS-REFERENCE TO RELATED APPLICATIONS

This application claims priority from Application No. GB0517741.5 filed in the United Kingdom on Aug. 31, 2005, the disclosure of which is incorporated herein by reference.

This invention relates to sensitivity control of an image sensor. In particular, the invention provides a method of partitioning a signal charge from incident photons, thus producing a manageable yield and a consequently higher, photon shot noise limited, signal to noise ratio than in the prior art, when imaging high flux rates of energetic photons or particles such as produced by x-ray generators.

BACKGROUND OF THE INVENTION

Image sensors which are used in a spectral range from hard UV, through x-rays to gamma-rays, i.e. with photon energies of 10 eV or greater, or in the imaging of energetic particles, e.g. free electrons, almost invariably produce a yield of many signal electrons per incident energetic photon or particle. Such high yields may be undesirable, particularly for small pixels, e.g. of 40 µm or less, designed for the visible spectral region, where only one signal electron is generated per incident photon. A common result when imaging energetic photons, is premature saturation of the pixel, and a low signal to noise ratio, limited by photon shot noise.

Such image sensors may include a sensitive layer coupled to a charge collection/readout structure, e.g. photoconductor or scintillator on a CMOS array, or may include an intrinsically sensitive charge collection/readout structure, e.g. deep active layer CMOS.

In a scintillator-based imager, the imager is coated with, or attached to, a scintillator layer. The scintillator converts, for example, incident x-ray photons to optical photons, and the image sensor converts the optical photons to an electrical signal. X-ray sensors based on a scintillator and a photodetector, typically a CMOS sensor, which converts the optical photons to an electrical signal, are well known. Intra-oral dental x-ray imaging typically uses such sensors.

An optimum x-ray sensor requires a satisfactory balance between x-ray absorption in the scintillator and spatial resolution for a particular scintillator. A thin scintillator provides low light levels to the detector, but has a high spatial resolution. A thicker scintillator stops more x-ray photons, and provides higher light levels to the detector, up to a thickness at which absorption and scattering leads to fewer light photons being transmitted through the scintillator to the detector, but has a lower spatial resolution because of scattering in the scintillator. Even with a fixed thickness of a same scintillator material, obtaining a constant light level per unit x-ray dose to the sensor may not be straightforward in manufacture, for example, because of variations in density or porosity of the material.

Scintillator materials are chosen for high effective atomic number $Z_{eff}$, light output that is a good spectral match to the detector, and a reasonable light yield, preferably >20 photon/keV. Some scintillators have a higher light yield, e.g. 40 photon/keV, including doped halides such as CsI, and gadolinium oxy-sulphide (GOS). Other scintillators, such as lead tungstate, and scintillating fibre-optics, have a higher x-ray stopping power, but a lower light output, e.g. <10 photons per keV. However, matching of a scintillator to an imaging device has tended to be only by experimentation. Moreover, there is often excess signal available from the scintillator.

Use of a range of typical scintillators of different thicknesses, for example to facilitate low-sensitivity, high-resolution and high-sensitivity, low-resolution options, and typical manufacturing variations of particular scintillators, can easily result in an order of magnitude variation in per pixel signal yield per x-ray photon.

In a photoconductor-based imager an imager is coated with, or attached to, a photoconductor layer. This layer has a bias field $V_{bias}$ applied, for example by means of opposed metal contacts. When charge is generated in the photoconductor, the bias field sweeps the generated charge into a pixel structure. X-ray sensors based on a photoconductor are well known. Mammography and chest radiography applications typically use such sensors. Typical photoconductor materials include amorphous selenium, PbO, $PbI_2$, $HgI_2$ and CdZnTe.

The signal yield is often very high, e.g. 200e– (signal)/keV (photon), i.e. a single 30 keV x-ray photon will generate 6000 signal electrons. In an integrating imaging mode, if applied to a 20 µm pixel, as few as 50 x-ray photons may cause pixel saturation. In the current state-of-the-art, pixels are typically 50 µm or larger, in order to provide sufficient charge storage capacity. However, this imposes a limit on the spatial resolution of the imager.

In an intrinsically sensitive imager signal is directly generated in the imager pixel. X-ray sensors with intrinsic sensitivity are well known. Industrial and security and other scientific applications typically use such sensors. Typical imager materials include cadmium telluride (CdTe) and cadmium zinc telluride (CdZnTe), and also intrinsic silicon detectors, e.g. of 300 micrometer thickness.

The signal yield is often very high, e.g. 276e– (signal)/keV (photon), i.e. a single 30 keV x-ray photon will generate 8280 signal electrons. In an integrating imaging mode, if applied to a 20 µm pixel, as few as 36 x-ray photons may cause pixel saturation. In the current state-of-the-art, pixels are typically 50 µm or larger, in order to have sufficient charge storage capacity. However, this imposes a limit on the spatial resolution of the imager.

JP-11352230-A discloses an x-ray image detector having an electrochromic film sandwiched between a scintillator and a solid-state detector. Optical transmittance of the electrochromic film is adjusted by application of an electric field variably to attenuate light from the scintillator to the solid-state detector. This requires a relatively complicated structure compared with a standard solid-state imaging sensor without variable attenuation. The spatial resolution of the sensor may be degraded by a diffusing effect of the electrochromic layer. The electrochromic layer may add extra defects to the image.

Where imaging devices are used with fixed iris lenses and there is a need to control exposure, this may be done by varying a sensor integration time: a method often called electronic shuttering. Electronic shuttering is more precise than mechanical shuttering and can include times shorter than possible with a mechanical shutter. Integration time is decreased, e.g. to 10 µs and less, for imaging relatively bright objects to avoid saturating the pixels, or is increased, e.g. to 20 ms and more, to increase grey scale resolution of relatively dim objects. In video imaging applications the integration time is less than an inverse of the frame rate.

U.S. Pat. No. 6,825,059 discloses a controllable electronic shutter included in each pixel cell in order to provide a more efficient and versatile way of setting integration time of the array or part of the array. In some applications—e.g. fast shutter, motion capture or snap shot imaging, it is advantageous for all the pixels to be integrated simultaneously for the same period of time. In each pixel, signal charge is dumped or read.

In all cases, it is implicit that there will only be one on/off dump cycle per image or video frame. The rate of arrival of photons is relatively high. When signal charge is collected, all the signal charge is retained, but the signal is only collected from some of the incident photons. The yield of signal charge is fixed at the intrinsic rate of one signal electron from each detected photon Given the high number of photons per frame, e.g. of the order of 100,000, the photon shot noise limit is not usually a problem There is also disclosed coating of an imager with a scintillator, which accepts x-ray radiation and then emits green light to the imager. However, in all cases, it is implicit that there will only be one on/off dump cycle per image or video frame. When signal charge is collected, all the signal charge is retained, but the signal is only collected from some of the incident photons.

U.S. Pat. No. 6,097,021 discloses an optical sensor array with a switch control logic circuit to control start and stop times of integration periods of each optical sensor, in particular for document scanning to avoid skew images. There is no disclosure of the use of such control logic in other than an optical sensor.

U.S. Pat. No. 6,403,965 describes an x-ray imager wherein the pixel signal per incident x-ray photon may be increased via amplification in a high electric field in an x-ray-to-charge converting layer. The technique is said to be of benefit at very low signal levels. However, the yield of signal per incident photon, already high, is increased and so the pixel has to be even larger, approx 200 µm, to provide very high well capacity but providing low resolution. The signal to noise is still photon shot noise limited at high flux levels. There is a possibility of avalanche breakdown in the high electric field (1 E8 V/m).

It is an object of the present invention at least to ameliorate the aforesaid shortcomings in the prior art.

BRIEF SUMMARY OF THE INVENTION

According to a first aspect of the invention, there is provided a method of operating an image sensor including the steps of: providing an array of pixel structures each having photodetector means and dump drain means controlled by dump gate means; exposing the photodetector means to radiation to generate charge in the photodetector means; and alternately dumping charge to the dump drain means from the photodetector means and reading charge from the photodetector means in a duty cycle, within a single exposure or frame, at a frequency at least equal to a reciprocal of a decay time of the photodetector means.

Conveniently, the step of providing an array of pixel structures includes providing each of the array of pixel structures with transfer gate means for controlling reading of charge from the photodetector means and the step of selectively dumping charge to the dump drain means from the photodetector means and reading charge from the photodetector means comprises pulsing the dump gate means and the transfer gate means at a predetermined frequency greater than a reciprocal of a decay time of the photodetector means for varying the effective sensitivity of the photodetector means.

Advantageously, the step of providing an array of pixel structures includes providing scintillator means for converting radiation for detection by the photodetector means and the step of selectively dumping charge to the dump drain means from the photodetector means and reading charge from the photodetector means comprises pulsing the dump gate means and the transfer gate means at a predetermined frequency greater than a reciprocal of a decay time of the scintillator means for varying the effective sensitivity of the photodetector means.

Conveniently, the step of selectively dumping charge to the dump drain means from the photodetector means and reading charge from the photodetector means comprises monitoring, during exposure, charge read from a sample of the pixel structures and varying a rate of collection of signal charge accordingly.

Optionally, the step of selectively dumping charge to the dump drain means from the photodetector means and reading charge from the photodetector means comprises varying a rate of reading charge during exposure according to a predetermined pattern.

Advantageously, the step of varying a rate of reading charge during exposure according to a predetermined pattern comprises reading charge at a first rate during a first portion of the exposure and reading charge at a lower rate during a second portion of the exposure later than the first portion.

Advantageously, a dark frame is integrated under same conditions as an image frame for processing the image frame to reduce fixed pattern noise caused by offset differences from separate photodetector and storage areas.

Advantageously, the method further comprises applying a flat field correction to reduce fixed pattern noise caused by differences in pixel structure response.

Conveniently, the photodetector means is a photoconductor and the step of selectively dumping charge to the dump drain means from the photodetector means and reading charge from the photodetector means comprises applying an electric field to the photoconductor to transfer charge from the photoconductor.

Advantageously, the method further comprises selectively operating the image sensor in one of an integration mode and a photon counting mode.

Conveniently, the step of providing an array of pixel structures comprises providing pixel structures including photodetector means, transfer gate means for controlling charge collection from the photodetector means and dump drain means controlled by dump gate means, arranged for selectively dumping charge to the dump drain means and collecting charge from the photodetector means for varying effective sensitivity of the pixel structure.

Conveniently, the step of providing an array of pixel structures comprises providing pixel structures arranged to partition the signal charge from each incident photon and not charge accumulated from a proportion of the photons.

Conveniently, the photodetector means is a pinned photodiode.

Optionally, the photodetector means is a photo-gate.

Optionally, the photodetector means comprises a photoconductor subjectable to an electric field for transferring charge from the photodetector means to a charge storage element of the pixel structure.

Optionally, the pixel structure is intrinsically sensitive and the charge is transferable to a charge storage element of the pixel structure.

Conveniently, a selectable proportion of charge generated in the photodetector means is storable in a storage region of the pixel structure.

Advantageously, the image sensor is arranged for sensing x-rays.

Conveniently, the method is adapted for intra-oral x-ray imaging

According to a second aspect of the invention, there is provided an image sensor comprising an array of pixel structures each having photodetector means, wherein charge is generated in the photodetector means when exposed to radiation; dump drain means controlled by dump gate means; and control circuitry arranged alternately, in a duty cycle, within a single exposure or frame, at a frequency at least equal to a reciprocal of a decay time of the photodetector means, to dump charge to the dump drain means from the photodetector means or to transfer charge from the photodetector means for controlling effective sensitivity of the photodetector means.

Conveniently, each member of the array of pixel structures further comprises transfer gate means for controlling reading of charge from the photodetector means and the control circuitry is arranged to pulse the dump gate means and the transfer gate means at a predetermined frequency greater than a reciprocal of a decay time of the photodetector means for varying the effective sensitivity of the photodetector means.

Advantageously, the image sensor includes scintillator means for converting radiation for detection by the photodetector means, wherein the control circuitry is arranged to pulse the dump gate means and the transfer gate means at a predetermined frequency greater than a reciprocal of a decay time of the scintillator means for varying the effective sensitivity of the photodetector means.

Advantageously, the control circuitry is arranged to monitor, during exposure, charge read from a sample of the pixel structures and to vary a rate of collection of signal charge accordingly.

Conveniently, the control circuitry is arranged to vary a rate of reading charge during exposure according to a predetermined pattern.

Optionally, the control circuitry is arranged to read charge at a first rate during a first portion of the exposure and to read charge at a lower rate during a second portion of the exposure later than the first portion.

Conveniently, the control circuitry is arranged to integrate a dark frame under same conditions as an image frame for processing the image frame to reduce fixed pattern noise caused by offset differences from separate photodetector and storage areas.

Conveniently, the photodetector means is a photoconductor and the control circuitry is arranged to apply an electric field to the photoconductor to transfer charge from the photoconductor.

Conveniently, the control circuitry is arranged selectively to operate the image sensor in one of an integration mode and a photon counting mode.

Conveniently, the control circuitry is arranged to partition the signal charge from each incident photon and not charge accumulated from a proportion of the photons.

Optionally, the photodetector means is a pinned photodiode.

Optionally, the photodetector means is a photo-gate.

Optionally, the photodetector means comprises a photoconductor subjectable to an electric field for transferring charge from the photodetector means to a charge storage element of the pixel structure.

Optionally, the pixel structure is intrinsically sensitive and the charge is transferable to a charge storage element of the pixel structure.

Conveniently, a selectable proportion of charge generated in the photodetector means is storable in a storage region of the pixel structure.

Advantageously, the image sensor is arranged for sensing x-rays.

Conveniently, the image sensor is arranged for intra-oral x-ray imaging.

Conveniently, the array of pixel structures and the control circuitry are arranged on a same semiconductor die.

Conveniently, at least one of the array of pixel structures and the control circuitry are CMOS structures.

Advantageosuly, the control circuitry is arranged to sweep dark charge out of the imaging array during a standby mode of the sensor.

Conveniently, the control circuitry is further arranged to read out stored charge from the array of pixel structures for formation of an image.

BRIEF DESCRIPTION OF THE SEVERAL VIEWS OF THE DRAWINGS

The invention will now be described, by way of example, with reference to the accompanying drawings in which.

In the Figures like reference numerals denote like parts.

DETAILED DESCRIPTION OF THE INVENTION

The invention may be applied to a scintillator-based image sensor in which structures in the pixel cause a charge dump/transfer action and so sub-divide the initial signal charge before it is accumulated in a storage or readout element of the pixel and subsequently converted to an output electrical signal.

Figure 1:
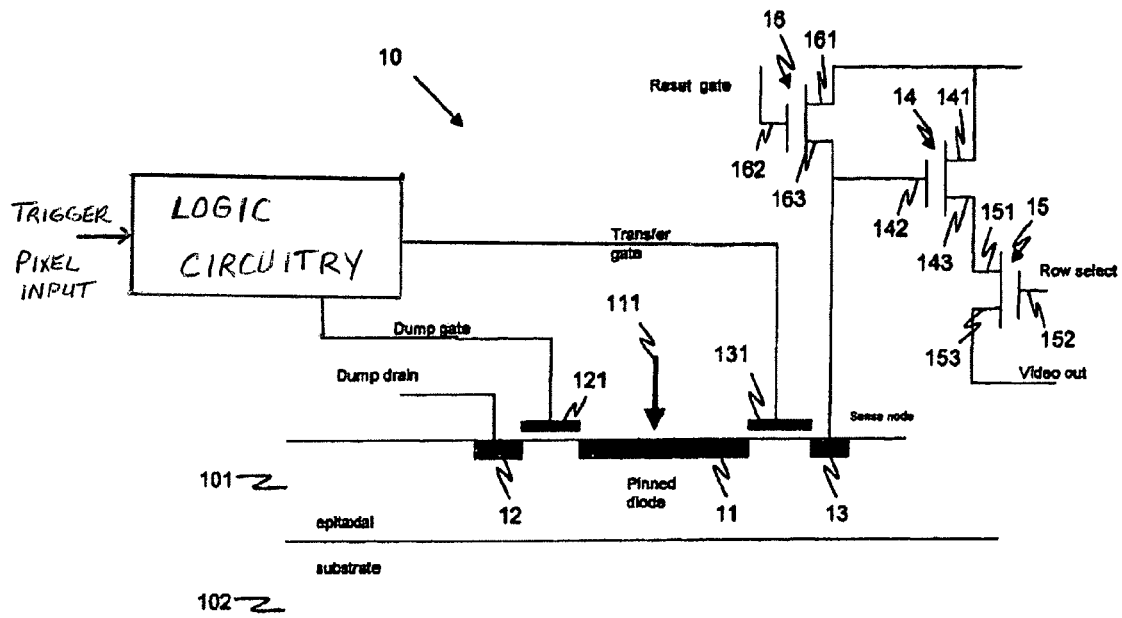
FIG. 1 is a schematic diagram of a pinned photodiode pixel, with a dump gate and dump drain, suitable for use in the invention.

Referring to FIG. 1, an x-ray sensor pixel 10 according to the invention includes a pinned photodiode 11, formed in an epitaxial layer 101 on a substrate 102, or built in silicon according to any known process, arranged to receive incident light 111 from a scintillator (not shown). Electrical charge generated by the incident light in the pinned diode 11 is transferable from the pinned diode to a dump drain 12 controlled by a dump gate 121. Charge is alternatively transferable to a sense node 13 controlled by a transfer gate 131. The sense node is connected in a known manner to a gate 142 of a buffer transistor 14. An output 143 of the buffer transistor is connected to an input 151 of a select transistor 15 from which output 153 is controlled by a row select gate 152. The sense node 13 is also electrically connected to an output 163 of a reset transistor 16 controlled by a reset gate 162. An input 161 of the reset transistor and an input 141 of the buffer transistor are connected to a common line.

The pixel 10 provides a facility to adjust effective sensitivity of the pixel, for example to scintillator light, via a combination of fast charge dump and fast charge transfer in the pixel structure. This allows one sensor, containing an array of such pixels, either to use most of a signal from a low output scintillator, or to use a small fraction of a signal from a high output scintillator, while avoiding pixel well saturation. Such an order of magnitude adjustment provides a useful range of sensitivity. This sensitivity variation is achieved by varying the signal per x-ray photon using a charge dump or store duty cycle.

The pixel 10 has a fast, preferably ~10 μs, charge dump/charge transfer response. The pixel 10 consists of a separate photodetector 11 and storage capacitor/readout node 13 per pixel, with a transfer/isolation gate 131 between them. Charge collected in the photodetector 11 can then either be dumped in the dump drain 12 or transferred to the storage capacitor 13 for subsequent reading as required. The photodetector may be either a photodiode 11 or a photo-gate 21 structure.

Figure 2:
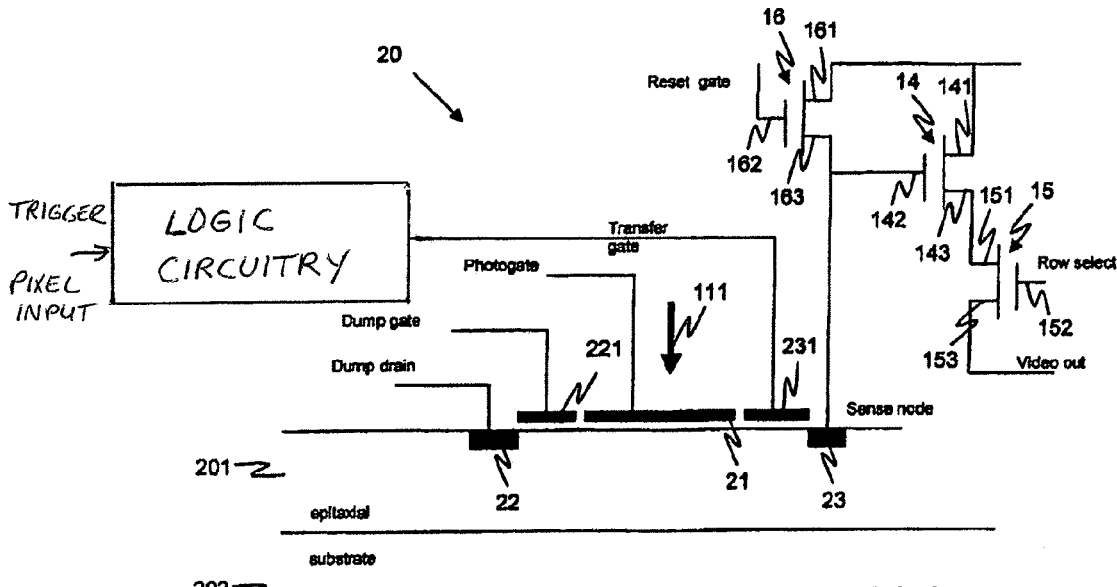
FIG. 2 is a schematic diagram of a photo-gate pixel, with a dump gate and dump drain, suitable for use in the invention.

Referring to FIG. 2, a second embodiment of an x-ray sensor pixel for use in the invention includes a photo-gate 21, formed above an epitaxial layer 201 on a substrate 202, or built in silicon according to any known process, arranged to receive incident light 111 from a scintillator, or photoconductor, not shown. Electrical charge generated by the incident light underneath the photo-gate 21 is transferable to a dump drain 22 controlled by a dump gate 221. Charge is alternatively transferable to a sense node 23 controlled by a transfer gate 231. The sense node is connected in a known manner to a gate 142 of a buffer transistor 14. An output 143 of the buffer transistor is connected to an input 151 of a select transistor 15 from which output 153 is controlled by a row select gate 152. The sense node 23 is also electrically connected to an output 163 of a reset transistor 16 controlled by a reset gate 162. An input 161 of the reset transistor 16 and an input 141 of the buffer transistor 14 are connected to a common line.

A conventional known photo-gate pixel is fabricated with a single polysilicon (single poly) process but with gaps, filled with a diffusion, between the photo-gate and transfer gate. This structure makes it difficult to ensure complete charge transfer to the readout node from the photo-gate. In a known CMOS sensor the result is likely to be some image lag. For a standard dental x-ray imager, the image lag is not a problem, since the imaging mode is single shot. However, for duty-cycle sensitivity control of the invention, the effective amount of lag charge may be different for transfer from the photo-gate to the readout node and the dump drain. This would result in fixed pattern noise. A two-polysilicon CMOS process may give a photo-gate structure with better performance.

A conventional photodiode detector is likely to suffer from similar fixed pattern problems when used in this structure, as the diode will be reset to a different potential, and therefore contain a different quantity of charge, after signal transfer to the readout node or dump drain.

Most suitable pixel structures are a pinned photodiode pixel 10 and a photo-gate pixel 20. The pinned photodiode 11 is normally fully depleted, so there is no lag, and the transfer gates 131, 121 for allowing charge flow to the readout node 13 or dump drain 12, respectively, are made in a same poly. In each case an additional dump gate 121; 221 and drain 12; 22, which may be in common with an existing drain in the pixel, are required in addition to the basic pixel structure.

Figure 5:
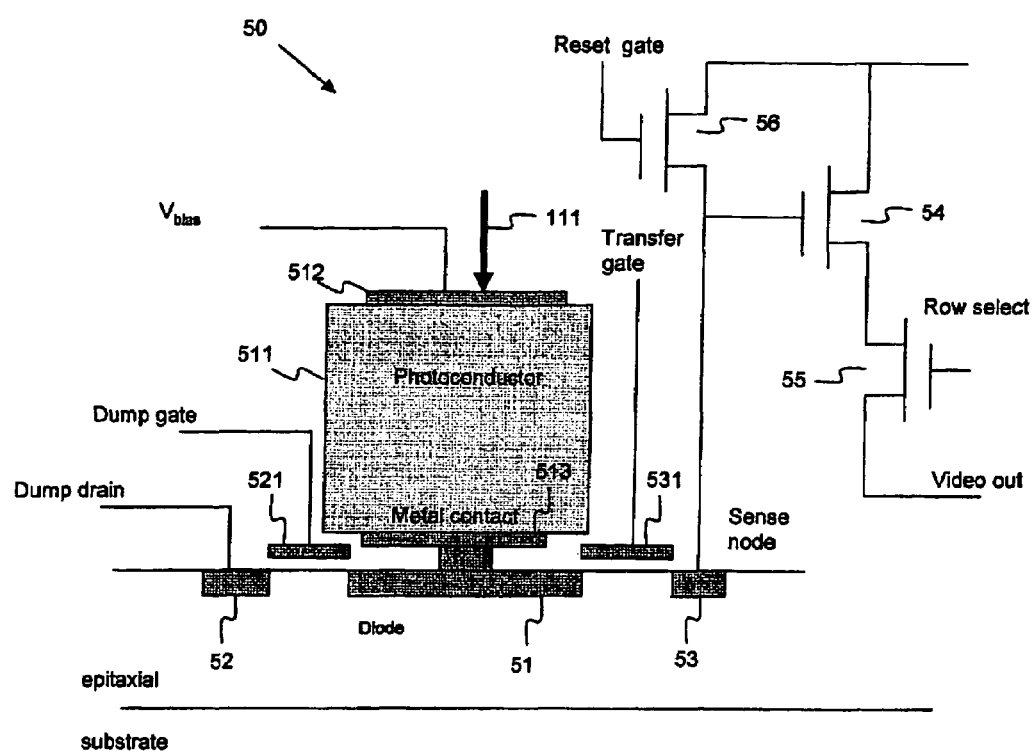
FIG. 5 is a schematic diagram of a photoconductor/diode pixel structure with a dump gate and dump drain suitable for use in the invention.

Referring to FIG. 5, the invention may alternatively be applied to a photoconductor-based imager 50 in which structures in the pixel cause a charge dump/transfer action and so sub-divide the initial signal charge before it is accumulated in a storage or readout element of the pixel and subsequently converted to an output electrical signal. An imager is coated with, or attached to, a photoconductor layer 511. This layer has a bias field $V_{bias}$ applied, e.g. of 1V per μm by means of opposed metal contacts 512, 513. When charge is generated in the photoconductor 511, the charge is swept by the field into a storage element 51 of the pixel. From the storage element 51, charge may be dumped in a dump drain 52, controlled by a dump gate 521, or transferred to a sense node 53, controlled by a transfer gate 531. From the sense node the charge is read by a read circuit 54, 55. The sense node may be reset by a reset gate 56.

The invention may alternatively be applied to an intrinsically sensitive imager in which structures in the pixel cause a charge dump/transfer action and so sub-divide the initial signal charge before it is accumulated in a storage or readout element of the pixel and then converted to an output electrical signal.

An imager pixel for such an imager has a photo-sensitive region of sufficient active depth to produce signal charge from an acceptable proportion of incident photons or particles. In order for the duty cycle technique to be effective, the imager must have some lag, e.g. a laggy photodiode, or of material such as amorphous silicon.

Figure 3:
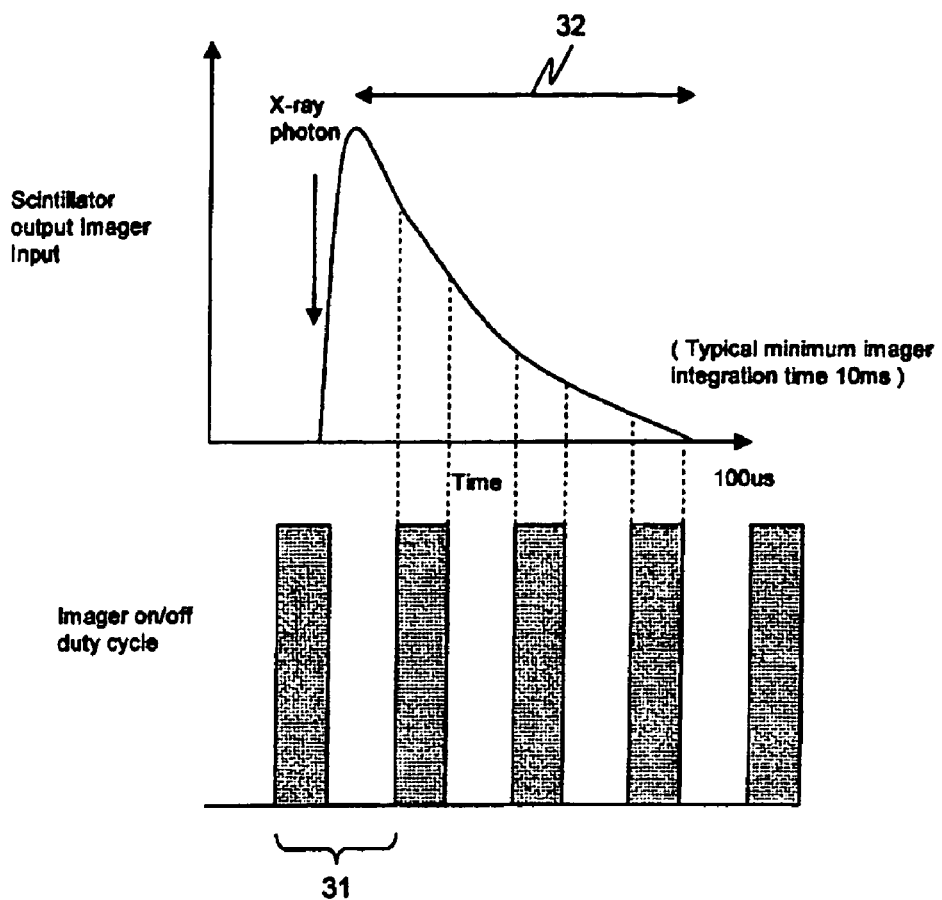
FIG. 3 is a graph of scintillator, photoconductor, or laggy intrinsic semiconductor output versus time in relation to a duty cycle of an imaging device according to the invention.

Referring to FIG. 3, a duty cycle 31 applied, according to the invention, to an image sensor has a frequency at least equal to a reciprocal of the decay 32 of the scintillator, photoconductor, or laggy intrinsic semiconductor, and preferably several times the reciprocal, so that signals from all incident x-ray photons are evenly reduced, and all x-ray photons detected are imaged.

Figure 4:
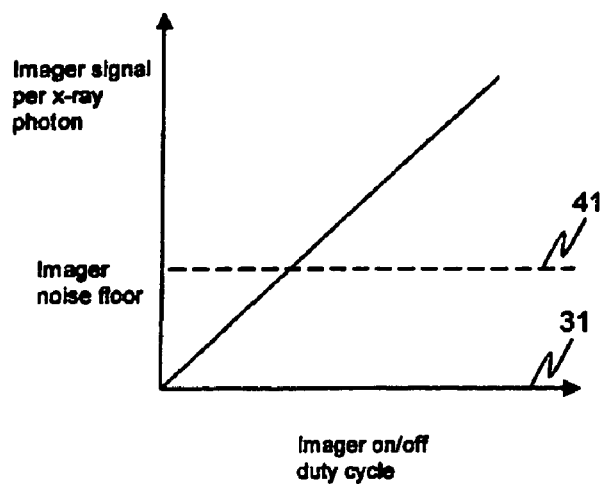
FIG. 4 is a graph of imager signal per x-ray photon versus imager duty cycle frequency, according to the invention.

Referring to FIG. 4, the duty cycle 31 needs to be such that a signal per x-ray photon is approximately equal to an imager readout noise 41. If the signal is much greater than the noise, the imager will saturate at too low a dose.

There is a variety of possible modes of use of the described imager with duty-cycle sensitivity control according to the invention.

In a first mode, a rate of collection of signal charge is reduced by a fixed amount by pulsing the charge dump gate 121; 221 and transfer gate 131; 231 with a certain mark-space ratio, at a frequency at least equal to the reciprocal of the decay 32 of the scintillator, photoconductor or laggy intrinsic semiconductor, e.g. 100 μs, and preferably at several times the reciprocal, such that there are always many cycles 31 per exposure period. The dependence on the decay time is necessary so that some light, and consequently signal charge, is received from all x-ray photons detected.

In a second mode, a rate of collection of signal charge is reduced by a variable amount by monitoring a resultant image during exposure to obtain feedback, and using this feedback to control the dump/transfer duty cycle and hence a gamma responsivity of the sensor. Sparse non-destructive readout during exposure is required, with a small fraction of the pixels being read repeatedly. For instance, a series of diagonal lines of pixels may be read by incrementing row and column clocks together. This mode could possibly be used for trigger as well as monitoring. In principle the system could 'learn' a user's, such as a dentist's, preferences and their x-ray source characteristics, and adapt a gamma curve to suit, thus, for example, creating a contrast stretched image on the sensor without the need for further processing in a PC.

In a third mode of operation, a rate of collection of signal charge is reduced by a variable amount according to a predetermined pattern to control the dump/transfer duty cycle 31 and hence the gamma responsivity. Typically the rate of charge collection is high for a first part of an exposure and reduced for later parts of the exposure.

A fixed pattern noise due to offset differences from separate photodiode and storage areas may be reduced by reading out a dark frame integrated under the same conditions as a signal frame, either in a standby period or immediately after the signal frame readout is completed.

A fixed pattern noise due to pixel to pixel response differences may need special attention due to flat field correction in the presence of different mark-space ratios. Often the mark-space ratio is fixed, for example to suit a particular scintillator type, or alternatively there are a limited number of states—i.e. only two, four or eight duty cycle possibilities—and a flat field is stored for each The invention provides the following advantages:
Allows use of one detector type with a variety of scintillators, in a variety of thicknesses, each with a range of light output levels and light output spectra. It is not necessary to optimize a particular detector for a particular scintillator, as is typically the case in the prior art.
Regulates a light-induced signal in the pixel in the charge domain, e.g. via charge transfer or dump, without interposing an optical (attenuating) layer between the fluorescent material and the image pick up element, thus avoiding possible degradation of the sensor MTF.
Enables optimization of small pixels both for high sensor spatial resolution, and for increased (photon shot noise based) signal to noise ratio. A conventional smaller pixel sensor, e.g. of 18 μm pixel size, will capture signal from relatively few x-ray photons before saturating. For instance, a known sensor may saturate with a particular scintillator after detecting 900 x-ray photons, and have a photon shot noise limit of 30 to 1. A sensor used according to the invention, with the same pixel size and with the same scintillator, but with the sensitivity control described, may be driven in a way to saturate at 9000 x-ray photons, and thus have a 95 to 1 photon shot noise limit Enables the optimization of small sensor pixels both for high spatial resolution and high exposure latitude (ratio of maximum x-ray exposure before saturation to minimum x-ray exposure for a usable signal to noise ratio) without the usual direct link to high pixel charge storage capacity.

The invention also provides increased exposure latitude/ gamma response. For ease of use, and certainty of obtaining useful images after every (patient) x-ray exposure, it is advantageous that an x-ray sensor (e.g. a combined scintillator and detector) has high exposure latitude. Useful images should result from both low and high x-ray exposures. Using existing methods it may not be possible to achieve sufficient pixel well capacity to cope with high output scintillators, with both high x-ray dose, and the small size of pixel consistent with the required spatial resolution.

It is not necessary to have a linear dose/signal response. For example, x-ray film has an S-shaped gamma curve so that large x-ray doses result in a lower incremental increase in film density than medium x-ray doses, i.e. some compression occurs. It is advantageous for an x-ray sensor to have a similar response. The same method used for sensitivity control described above can be used to achieve a higher exposure latitude, particularly for smaller pixels. The structures can be used to obtain a programmable gamma response function to suit a particular x-ray source or preference of a user.

In a typical x-ray imaging application a mean x-ray photon flux is reasonably constant and so normally the signal level is approximately proportional to the exposure time. A desired non-linear transfer function may therefore be obtained by varying a duty cycle during the x-ray pulse. Typically the duty cycle would be high at the start of the exposure, to give high sensitivity for short exposures, and be reduced during exposure to avoid saturation with longer exposures. This variation could be either to a predetermined pattern or adjusted in accordance with a signal level in the sensor, monitored by non-destructive readout during the exposure.

Thus the duty cycle technique of the invention may be used to reduce the signal yield so that many more photons can be imaged before saturation occurs, with a consequently higher signal to noise ratio. It may also be used to standardize the signal output per unit radiation dose over a range of scintillators/device combinations.

For the photoconductor-based imager in an integrating mode (low transfer/high dump), a typical signal yield is in the region of one signal electron per 6 eV of photon energy. An incident 30 keV photon will give rise to 5000 signal electrons. For a typical 20 μm pixel of 400 ke capacity, the well will be full after only 80 incident photons, and the photon shot noise limit will be <9 to 1. Using a charge dump/transfer duty cycle as described above, the effective signal yield (the fraction of signal charge per incident photon which is stored in the pixel) can be reduced by any amount. Often it will be advantageous to match the signal yield to the readout noise. If this is 100e, the duty cycle reduction factor will be 50. Accordingly, the saturation illumination will then rise to 4000 photons, and the maximum signal to noise ratio to 63 to 1. This signal to noise ratio is achieved together with the very good spatial resolution (MTF) of which a photoconductor-based device is also capable.

In a photon counting mode (high transfer/low dump), a typical signal yield is in the region of one signal electron per 6 eV of photon energy. An incident 30 keV photon will give rise to 5000 signal electrons. For a typical 20 μm pixel of 400 ke capacity, the well will be full after only 80 incident photons, but the imager frame rate is chosen to be greater than the incident photon arrival rate, so that the pixels counts one or less photons per frame.

Use of the invention provides a sensor which includes a facility to adjust a fraction of signal charge per incident photon which is generated in an upper photoconductive region, before it is stored in the pixel. This allows one sensor either to use most or all of a generated signal for a photon counting mode, or to use a small fraction of the signal for an integrating mode. Two orders of magnitude adjustment provide a useful range.

Such a photoconductor-based imager has wide application including dental x-rays, mammography and other medical x-ray examination.

Thus the duty cycle technique of the invention may be used with a photoconductor-based imager to reduce a signal yield so that many more photons can be imaged before saturation occurs, with a consequently higher signal to noise. Photoconductors often exhibit lag (retention of a fraction of the signal charge for a short time following exposure), but this is actually advantageous for the duty cycle technique, as described above. In a photon, or particle, counting imaging mode, the duty cycle technique may be switched off. The high signal per photon is then an advantage, since each photon may then be discriminated easily from readout noise, provided the photon arrival rate is sufficiently slow.

For an intrinsically sensitive imager in an integrating mode (low transfer/high dump), a typical signal yield (for silicon) is in the region of one signal electron per 3.6 eV of photon energy. An incident 30 keV photon will give rise to 8333 signal electrons. For a typical 20 μm pixel of 400 ke capacity, the well is full after only 48 incident photons, and photon shot noise limit will be <7 to 1. Using a charge dump/transfer duty cycle as described, the signal yield can be reduced by any amount. Often it will be advantageous to match the signal yield to the readout noise. If this is 100e, the duty cycle reduction factor will be 84. Accordingly, the saturation illumination will then rise to 4032 photons, and the maximum signal to noise ratio to 63. This signal to noise ratio will be achieved together with the excellent spatial resolution (MTF) of which a direct detection device is also capable.

In the photon counting mode (high transfer/low dump), a typical signal yield is in the region of one signal electron per 3.6 eV of photon energy. An incident 30 keV photon will give rise to 8333 signal electrons. For a typical 20 μm pixel of 400 ke capacity, the well will be full after only 48 incident photons, but the imager frame rate will be chosen to be greater than the incident photon or particle arrival rate, so that the pixels counts one or less photon or particles per frame.

Use of the invention with an intrinsically sensitive sensor provides a facility to adjust a fraction of signal charge per incident photon which is generated in a photosensitive region, before it is stored in the storage region of the pixel. This allows one sensor either to use most or all of a generated signal in a photon counting mode, or to use a small fraction of the signal in an integrating mode. Two orders of magnitude adjustment provide a useful range.

Using the charge transfer and dump facility described in respect of a photoconductor-based imager or an intrinsically sensitive sensor, there are two important operating modes:

low transfer/high dump—the sensor has a low signal per incident photon or particle, of the order of the noise floor—many photon or particles can be imaged before saturation occurs—this is an integrating mode. For sensors with many pixels and a relatively low frame rate, much less than the average photon or particle arrival rate per pixel, will often be the preferred mode.

high transfer/low dump—the sensor has a high signal per incident photon or particle, which is many times the noise floor—this is a photon counting mode. If the sensor is run with a sufficiently high frame rate, greater than the average photon or particle arrival rate per pixel, photon counting will often be the preferred mode.

Use of the invention provides the advantages in a photoconductor-based imager or an intrinsically sensitive sensor of:

small pixel size;
excellent MTF and spatial resolution;
very good signal to noise and dynamic range in integrating mode; and
a same sensor can be used either in a photon counting or integrating mode.

The duty cycle technique of the invention may thus be used to reduce the signal yield so that many more photons can be imaged before saturation occurs, with a consequently higher signal to noise ratio. In order for the duty cycle technique to be effective, the imager must have some lag, e.g. a laggy photodiode, or of material such as amorphous silicon.

In a photon or particle-counting imaging mode, the duty cycle technique may be switched off. The high signal per photon is then an advantage, since each photon may then be discriminated easily from readout noise, provided the photon arrival rate is sufficiently slow.

Use of the invention with any of the imagers described may be used for imaging any radiation that produces many signal electrons in a pixel per incident photon, including hard ultraviolet, x-rays and gamma rays.

Because of the high processing speeds required, the invention is preferably implemented on a semiconductor die, for example a CMOS semiconductor die, with, for example, an imaging array of pixels and, on a same semiconductor die, logic circuitry arranged to cause the imaging array selectively to dump charge generated in pixels of the imaging array to the pixel drains or to store the charge. The logic circuitry may be arranged alternately to dump charge and to store charge in an on-off duty cycle. The semiconductor die may suitably be arranged with the imaging array substantially central of the die and the logic circuitry arranged peripherally at least partially around the imaging array. Preferably trigger pixels are also included in the semiconductor die, either within or separate from the imaging array, for detecting irradiation.

In preferred embodiments of an imaging sensor, the logic circuitry is arranged to perform at least one of the following functions: in a standby mode to sweep dark charge out of the imaging array; examine the trigger pixels periodically, for example every 1 ms, and switch to an integration mode if radiation, such as x-rays, is detected by the trigger pixels; perform selective storing and dumping of generated charge, for example in a predetermined duty cycle during the integration mode; and reading out the stored charge to form an image at the end of the integration mode.

In the invention a duty cycle of charge collection/charge dump is rapid enough, and the characteristic decay time constant of light emission from the scintillator or charge release from the photoconductor is long enough, that some signal charge is collected from every incident photon. The energetic photons imaged normally yield 100's if not 1000's of electrons per photon detected in the pixel, but the duty cycle reduces this yield to a lower, more manageable amount. Given the few number of photons per frame, e.g. of the order of 100's to 1000's, the photon shot noise limit is usually a problem, and the invention aims to improve this limit.

We claim:

1. A method of operating an image sensor including the steps of:
   a. providing an array of pixel structures each having photodetector means and dump drain means controlled by dump gate means;
   b. exposing the photodetector means to radiation to generate charge in the photodetector means; and
   c. alternately dumping charge to the dump drain means from the photodetector means and reading charge from the photodetector means in a duty cycle, within a single exposure or frame, at a frequency at least equal to a reciprocal of a decay time of the photodetector means.

2. A method as claimed in claim 1, wherein the step of providing an array of pixel structures includes providing each of the array of pixel structures with transfer gate means for controlling reading of charge from the photodetector means and the step of selectively dumping charge to the dump drain means from the photodetector means and reading charge from the photodetector means comprises pulsing the dump gate means and the transfer gate means at a predetermined frequency greater than a reciprocal of a decay time of the photodetector means for varying the effective sensitivity of the photodetector means.

3. A method as claimed in claim 2, wherein the step of providing an array of pixel structures includes providing scintillator means for converting radiation for detection by the photodetector means and the step of selectively dumping charge to the dump drain means from the photodetector means and reading charge from the photodetector means comprises pulsing the dump gate means and the transfer gate means at a predetermined frequency greater than a reciprocal of a decay time of the scintillator means for varying the effective sensitivity of the photodetector means.

4. A method as claimed in claim 1, wherein the step of selectively dumping charge to the dump drain means from the photodetector means and reading charge from the photodetector means comprises monitoring, during exposure, charge read from a sample of the pixel structures and varying a rate of collection of signal charge accordingly.

5. A method as claimed in claim 1, wherein the step of selectively dumping charge to the dump drain means from the photodetector means and reading charge from the photodetector means comprises varying a rate of reading charge during exposure according to a predetermined pattern.

6. A method as claimed in claim 5, wherein the step of varying a rate of reading charge during exposure according to a predetermined pattern comprises reading charge at a first rate during a first portion of the exposure and reading charge at a lower rate during a second portion of the exposure later than the first portion.

7. A method as claimed in claim 1, wherein a dark frame is integrated under same conditions as an image frame for processing the image frame to reduce fixed pattern noise caused by offset differences from separate photodetector and storage areas.

8. A method as claimed in claim 1, comprising applying a flat field correction to reduce fixed pattern noise caused by differences in pixel structure response.

9. A method as claimed in claim 1, wherein the photodetector means is a photoconductor and the step of selectively dumping charge to the dump drain means from the photodetector means and reading charge from the photodetector means comprises applying an electric field to the photoconductor to transfer charge from the photoconductor.

10. A method as claimed in claim 1, comprising selectively operating the image sensor in one of an integration mode and a photon counting mode.

11. A method as claimed in claim 1, wherein the step of providing an array of pixel structures comprises providing pixel structures including photodetector means, transfer gate means for controlling charge collection from the photodetector means and dump drain means controlled by dump gate means, arranged for selectively dumping charge to the dump drain means and collecting charge from the photodetector means for varying effective sensitivity of the pixel structure.

12. A method as claimed in claim 11, wherein the step of providing an array of pixel structure comprises providing pixel structures arranged to partition the signal charge from each incident photon and not charge accumulated from a proportion of the photons.

13. A method as claimed in claim 11, wherein the photodetector means is a pinned photodiode.

14. A method as claimed in claim 11, wherein the photodetector means is a photo-gate.

15. A method as claimed in claim 11, wherein the photodetector means comprises a photoconductor subjectable to an electric field for transferring charge from the photodetector means to a charge storage element of the pixel structure.

16. A method as claimed in claim 11, wherein the pixel structure is intrinsically sensitive and the charge is transferable to a charge storage element of the pixel structure.

17. A method as claimed in claim 1, wherein a selectable proportion of charge generated in the photodetector means is storable in a storage region of the pixel structure.

18. A method as claimed in claim 1, wherein the image sensor is arranged for sensing x-rays.

19. A method as claimed in claim 1, adapted for intra-oral x-ray imaging.

20. An image sensor comprising an array of pixel structures each comprising:
   a photodetector device, wherein charge is generated in the photodetector device when exposed to radiation;
   a dump drain
   a dump gate coupled to control the dump drain; and
   control circuitry coupled to the dump gate and operative alternately, in a duty cycle, within a single exposure or frame, at a frequency at least equal to a reciprocal of a decay time of the photodetector device, to dump charge to the dump drain from the photodetector device or to transfer charge from the photodetector device for controlling effective sensitivity of the photodetector device.

21. An image sensor as claimed in claim 20, wherein each member of the array of pixel structures further comprises transfer gate means for controlling reading of charge from the photodetector device and the control circuitry is operative to pulse the dump gate and the transfer gate means at a predetermined frequency greater than a reciprocal of a decay time of the photodetector device for varying the effective sensitivity of the photodetector device.

22. An image sensor as claimed in claim 21, including scintillator means for converting radiation for detection by the photodetector device, wherein the control circuitry is operative to pulse the dump gate and the transfer gate means at a predetermined frequency greater than a reciprocal of a decay time of the scintillator means for varying the effective sensitivity of the photodetector.

23. An image sensor as claimed in claim 20, wherein the control circuitry is operative to monitor, during exposure, charge read from a sample of the pixel structures and to vary a rate of collection of signal charge accordingly.

24. An image sensor as claimed in claim 20, wherein the control circuitry is operative to vary a rate of reading charge during exposure according to a predetermined pattern.

25. An image sensor as claimed in claim 24, wherein the control circuitry is operative to read charge at a first rate during a first portion of the exposure and to read charge at a lower rate during a second portion of the exposure later than the first portion.

26. An image sensor as claimed in claim 20, wherein the control circuitry is operative to integrate a dark frame under same conditions as an image frame for processing the image frame to reduce fixed pattern noise caused by offset differences from separate photodetector and storage areas.

27. An image sensor as claimed in claim 20, wherein the photodetector device is a photoconductor and the control circuitry is operative to apply an electric field to the photoconductor to transfer charge from the photoconductor.

28. An image sensor as claimed in claim 20, wherein the control circuitry is operative selectively to operate the image sensor in one of an integration mode and a photon counting mode.

29. An image sensor as claimed in claim 20, wherein the control circuitry is operative to partition the signal charge from each incident photon and not charge accumulated from a proportion of the photons.

30. An image sensor as claimed in claim 20, wherein the photodetector device is a pinned photodiode.

31. An image sensor as claimed in claim 20, wherein the photodetector device is a photo-gate.

32. An image sensor as claimed in claim 20, wherein the photodetector device comprises a photoconductor subjectable to an electric field for transferring charge from the photodetector device to a charge storage element of the pixel structure.

33. An image sensor as claimed in claim 20, wherein the pixel structure is intrinsically sensitive and the charge is transferable to a charge storage element of the pixel structure.

34. An image sensor as claimed in claim 20, wherein a selectable proportion of charge generated in the photodetector device is storable in a storage region of the pixel structure.

35. An image sensor as claimed in claim 20, arranged for sensing x-rays.

36. An image sensor as claimed in claim 20, arranged for intra-oral x-ray imaging.

37. An image sensor as claimed in claim 20, wherein the array of pixel structures and the control circuitry are arranged on a same semiconductor die.

38. An image sensor as claimed in claim 20, wherein at least one of the array of pixel structures and the control circuitry are CMOS structures.

39. An image sensor as claimed in claim 20, wherein the control circuitry is operative to sweep dark charge out of the imaging array during a standby mode of the sensor.

40. An image sensor as claimed in claim 20, wherein the control circuitry is further operative to read out stored charge from the array of pixel structures for formation of an image.

* * * * *